(12) United States Patent
Takemoto

(10) Patent No.: US 10,264,704 B2
(45) Date of Patent: Apr. 16, 2019

(54) BRUSHLESS DC MOTOR, AND IDENTIFICATION METHOD AND IDENTIFICATION APPARATUS OF IDENTIFYING TYPE OF BRUSHLESS DC MOTOR

(71) Applicant: Nidec Corporation, Kyoto (JP)

(72) Inventor: Hideyuki Takemoto, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 0 days.

(21) Appl. No.: 15/966,017

(22) Filed: Apr. 30, 2018

(65) Prior Publication Data

US 2018/0317340 A1    Nov. 1, 2018

(30) Foreign Application Priority Data

May 1, 2017  (JP) ................................ 2017-091266
Sep. 8, 2017  (JP) ................................ 2017-172841

(51) Int. Cl.
*G06F 1/20* (2006.01)
*H02P 6/08* (2016.01)
*H05K 7/20* (2006.01)

(52) U.S. Cl.
CPC ......... *H05K 7/20209* (2013.01); *G06F 1/206* (2013.01); *H02P 6/08* (2013.01)

(58) Field of Classification Search
CPC ........................................................ H02P 6/08
USPC ................... 318/400.11, 400.09, 400.01, 700
See application file for complete search history.

(56) References Cited

U.S. PATENT DOCUMENTS

| 6,545,438 | B1 | 4/2003 | Mays, II |
| 6,570,358 | B2 * | 5/2003 | Nakatsugawa ........... H02P 6/16 |
| | | | 318/490 |
| 7,612,508 | B2 | 11/2009 | Jreij et al. |
| 7,844,750 | B2 | 11/2010 | Pearce et al. |
| 2011/0320043 | A1 | 12/2011 | Mikuszewski et al. |

FOREIGN PATENT DOCUMENTS

JP     08-23692 A    1/1996
JP     2003-102195 A    4/2003

* cited by examiner

*Primary Examiner* — David Luo
(74) *Attorney, Agent, or Firm* — Keating & Bennett, LLP

(57) ABSTRACT

A brushless DC motor includes a circuit board on which a terminal with an open-collector or open-drain output function is mounted. The terminal includes at least one of a first specific resistance connected in series to a switching element and a second specific resistance connected in parallel to the switching element. The first and second specific resistances vary among multiple types of brushless DC motors. A motor identification method includes: supplying a power supply voltage from an identification apparatus to the brushless DC motor; supplying a voltage to a signal line of the terminal via a pull-up resistance in the identification apparatus; inputting to the identification apparatus an identification voltage value set by the least one specific resistance and outputted from the terminal; and identifying a type of the brushless DC motor based on the identification voltage value.

17 Claims, 16 Drawing Sheets

【Fig. 1】
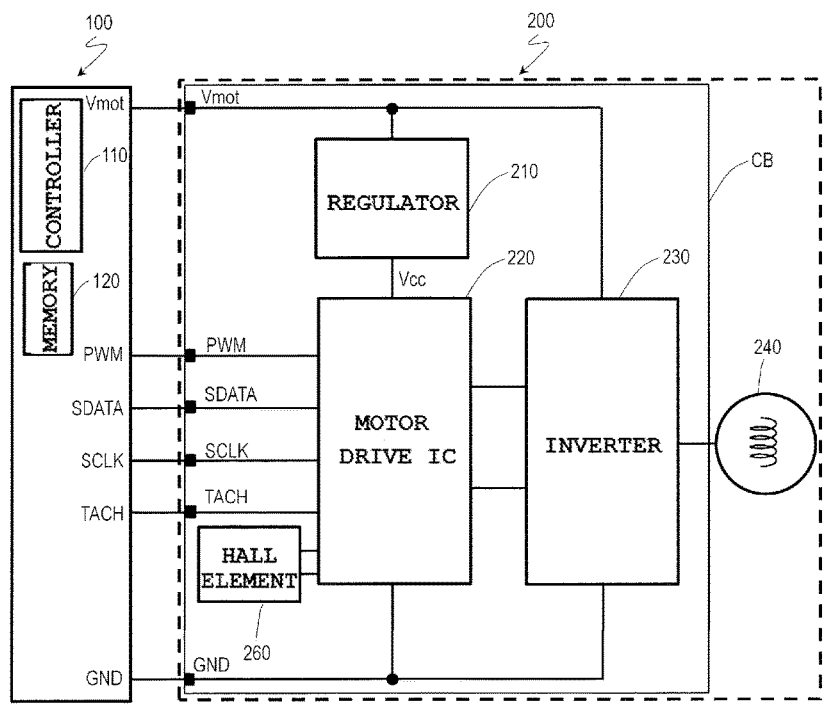

[Fig. 2]
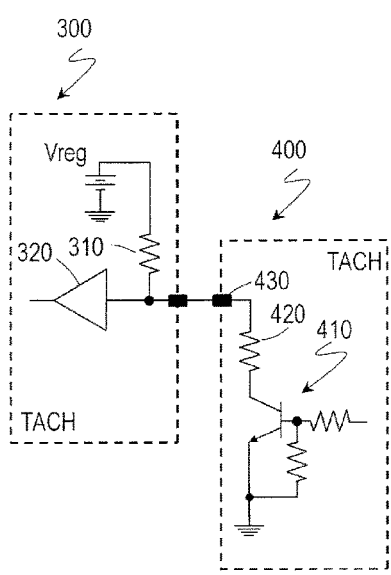

[Fig. 3]
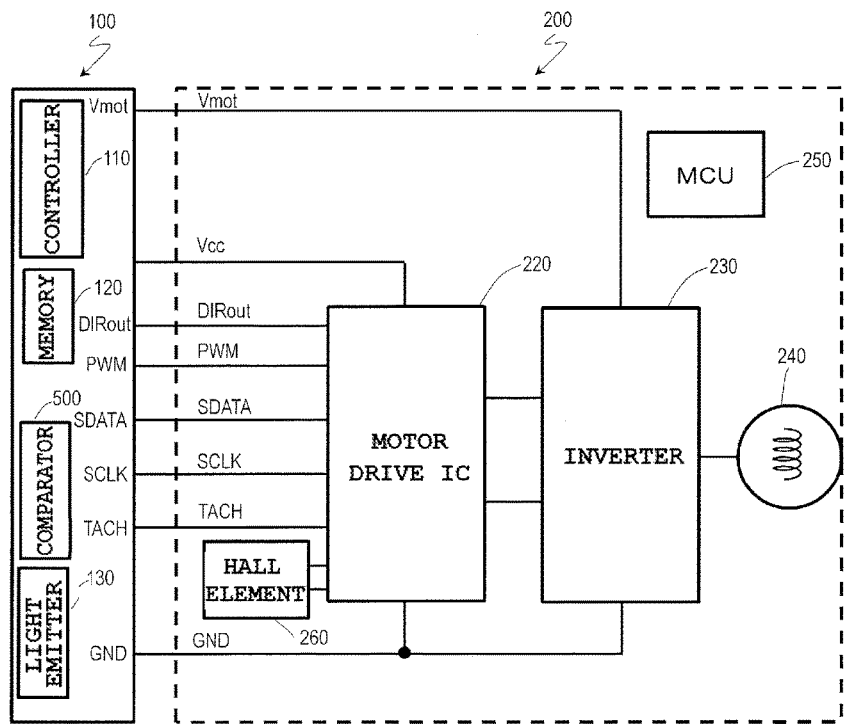

[Fig. 4]
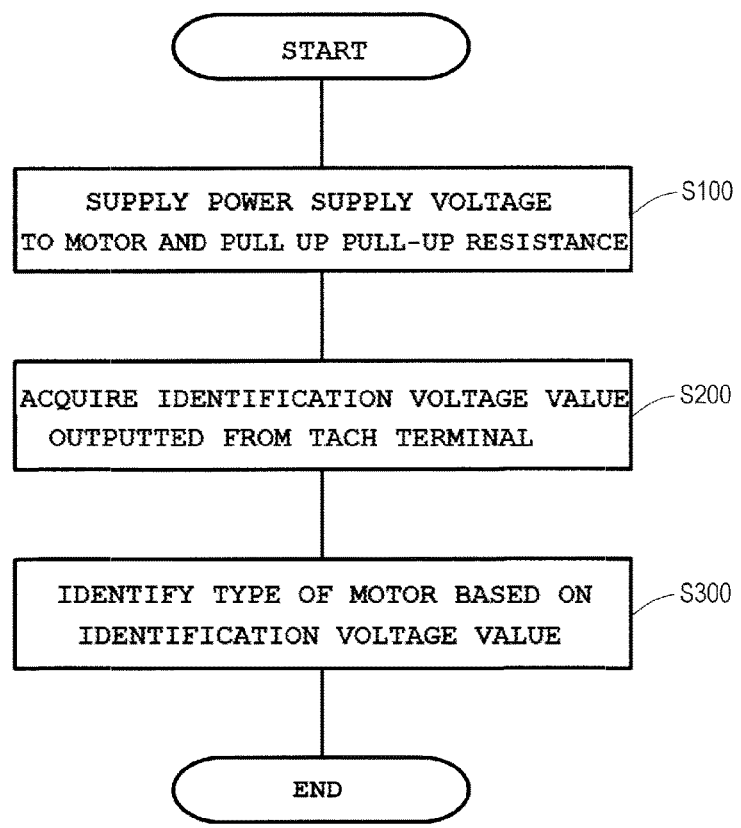

[Fig. 5]
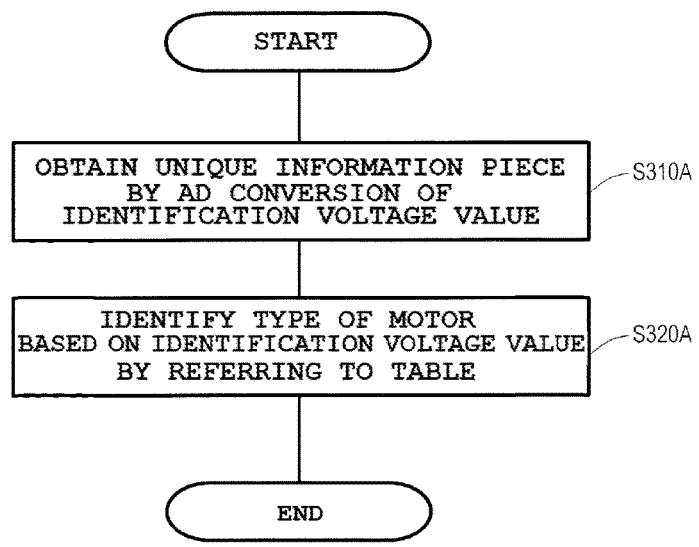

[Fig. 6]

| TYPE OF BRUSHLESS DC MOTOR | UNIQUE INFORMATION PIECE |
|---|---|
| 3'b001//SUPPLIER A | 10'h27A TO 10'h2A3 |
| 3'b010//SUPPLIER B | 10'h251 TO 10'279 |
| 3'b011//SUPPLIER C | 10'h228 TO 10'h250 |

[Fig. 7]
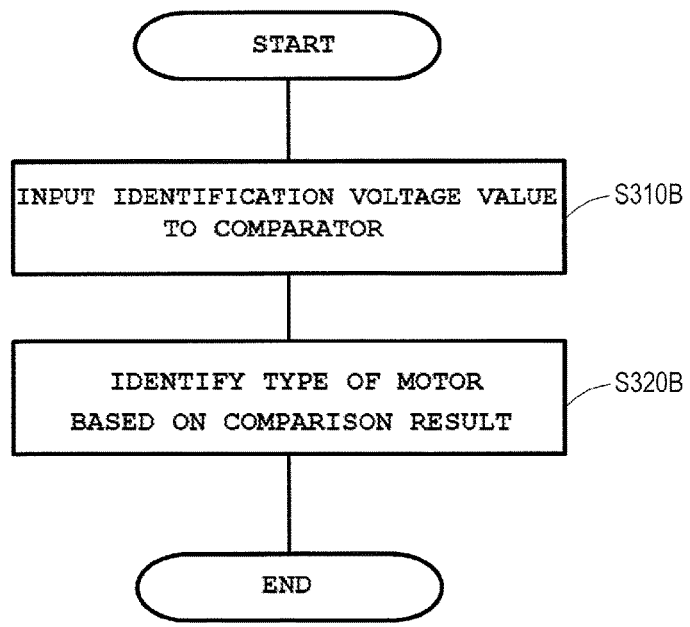

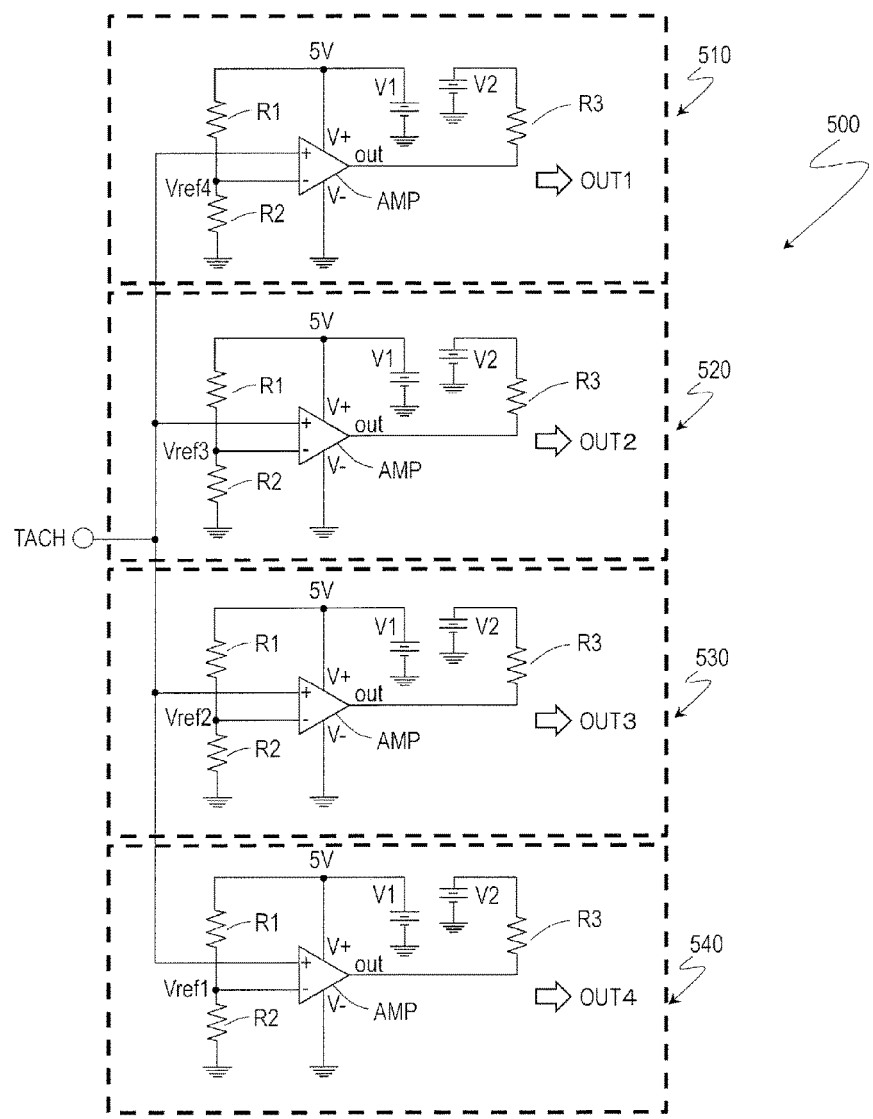
[Fig. 8]

[Fig. 9]
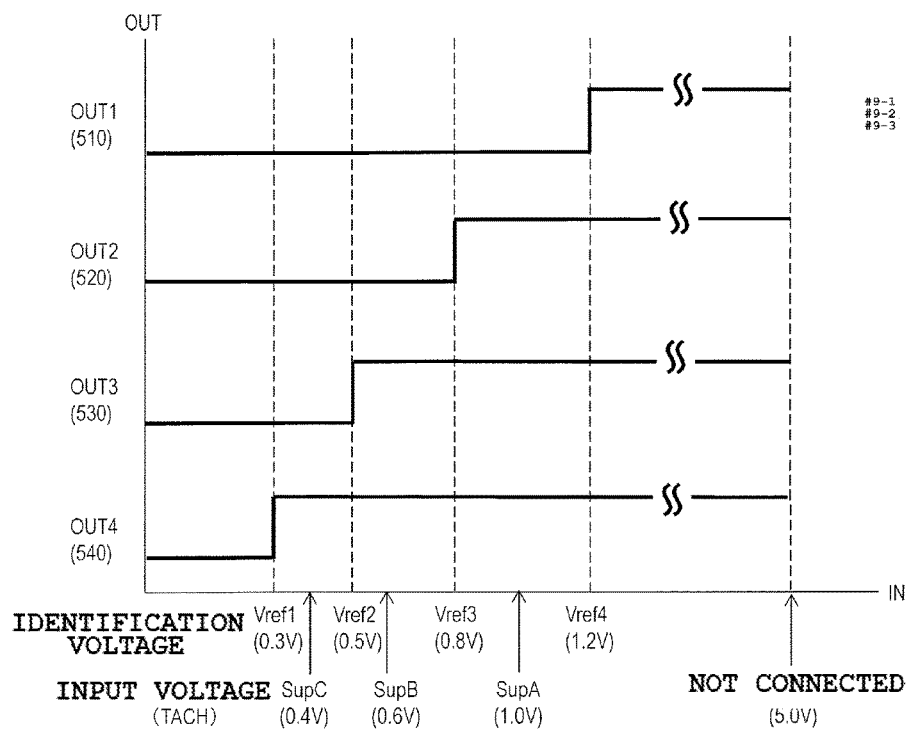

[Fig. 10]
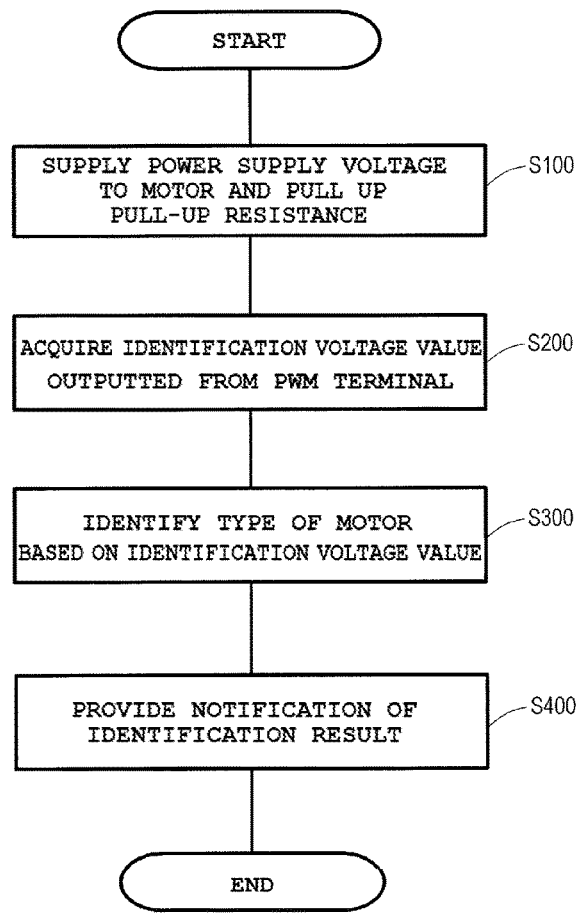

【Fig. 1 1】
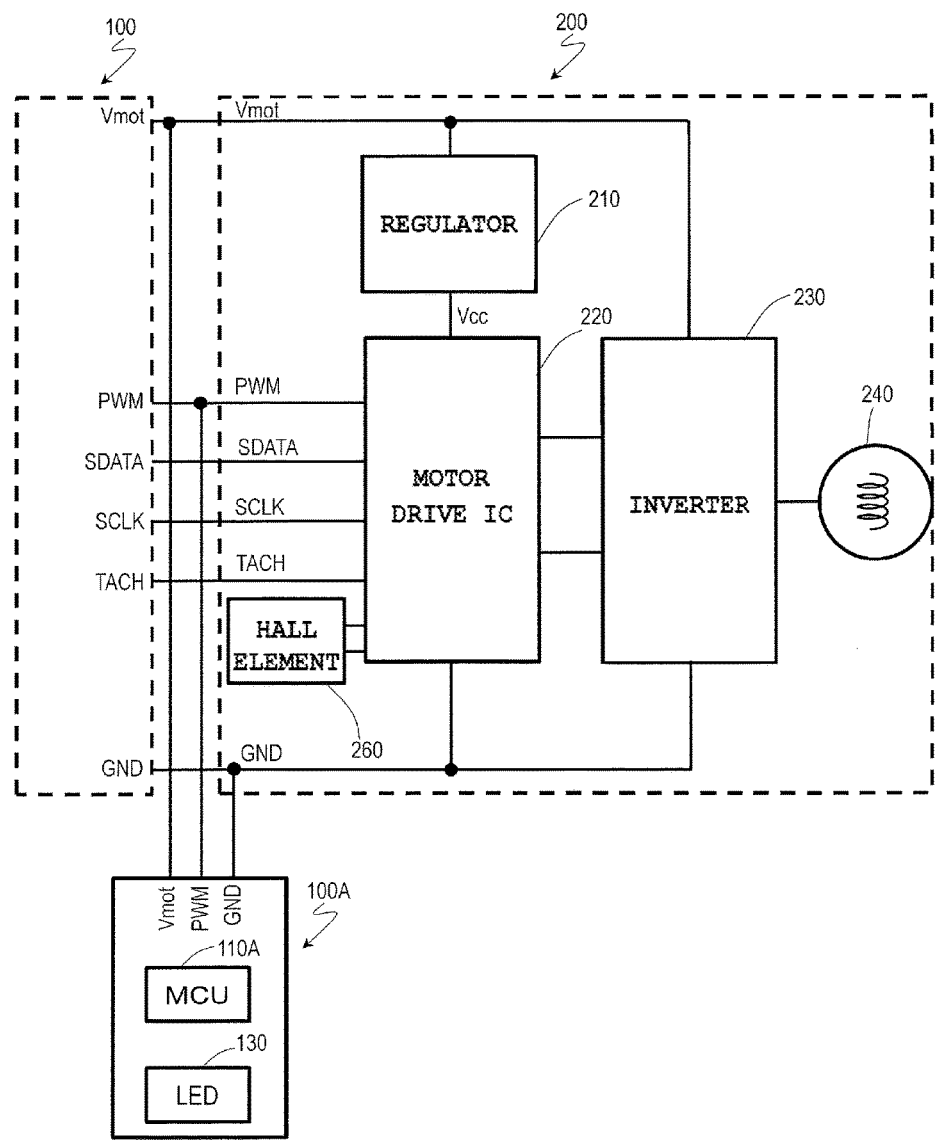

[Fig. 12]
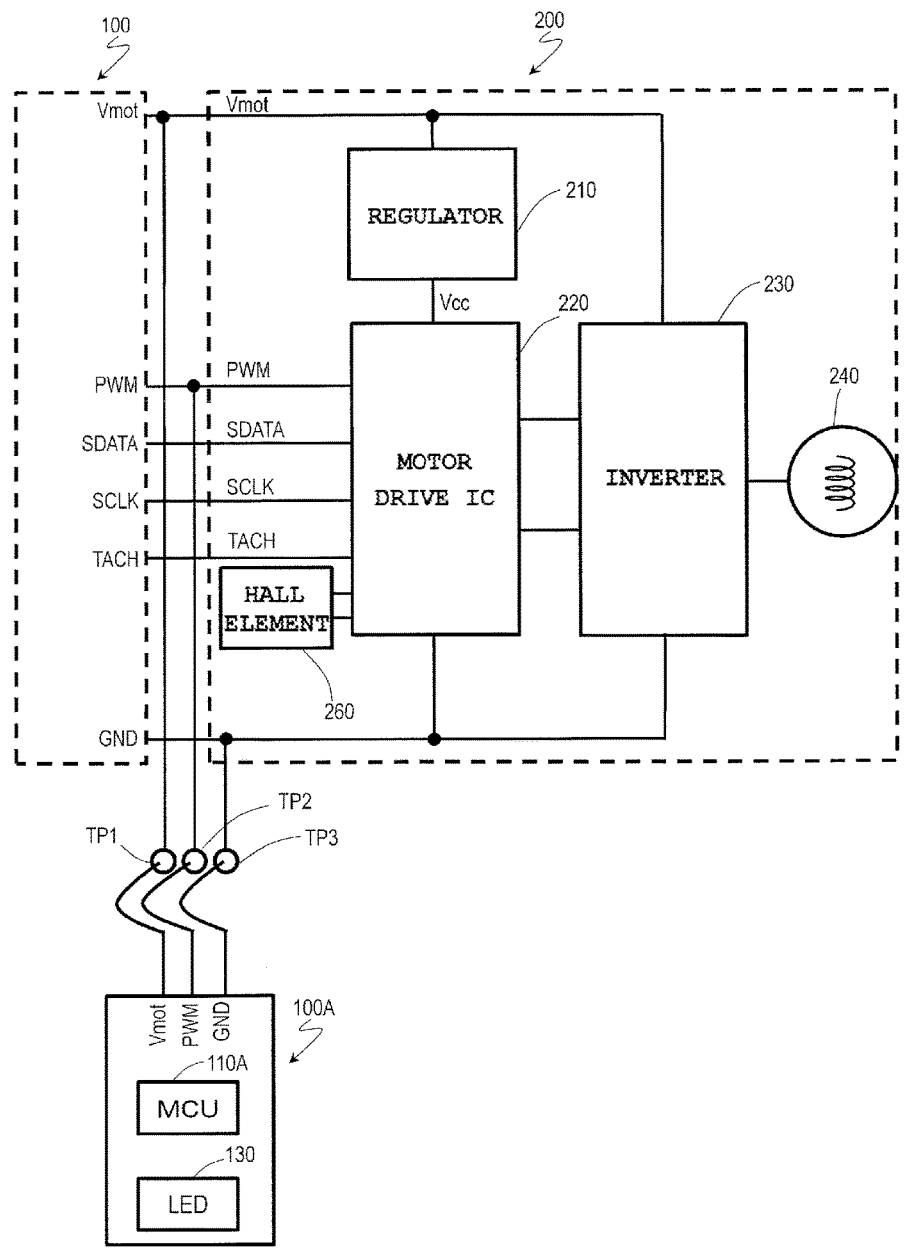

[Fig. 13]
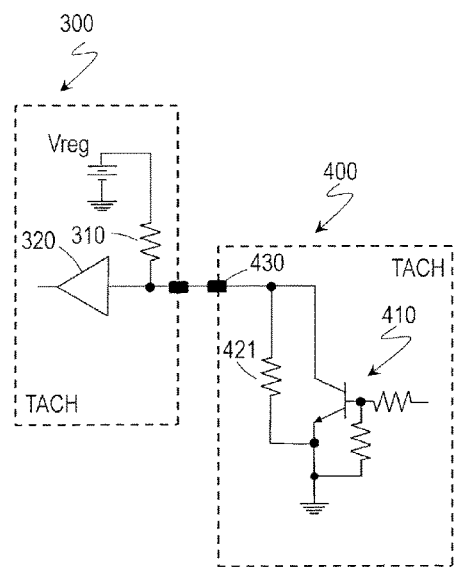

[Fig. 1 4]
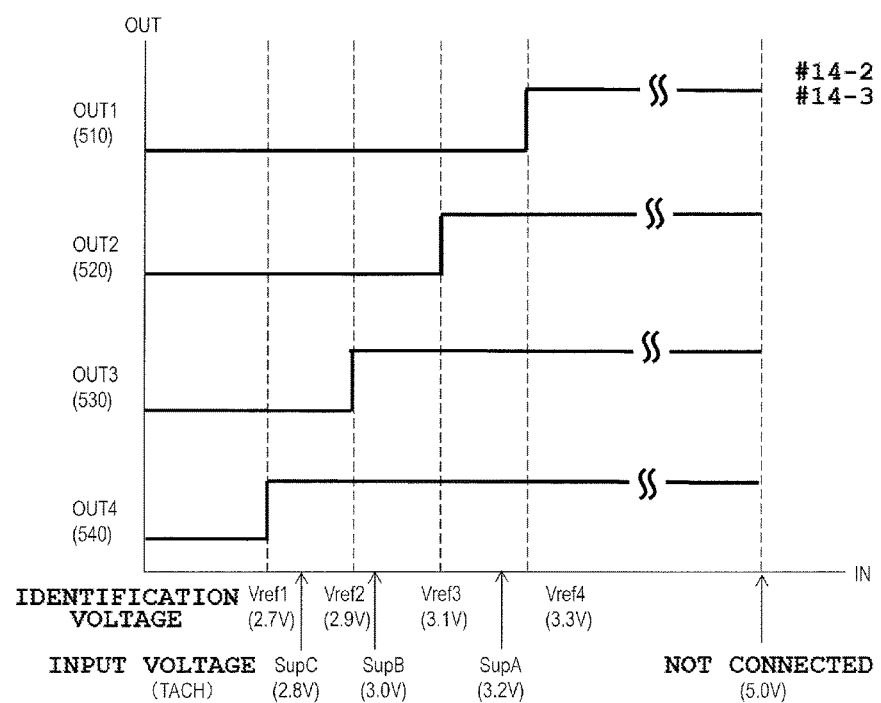

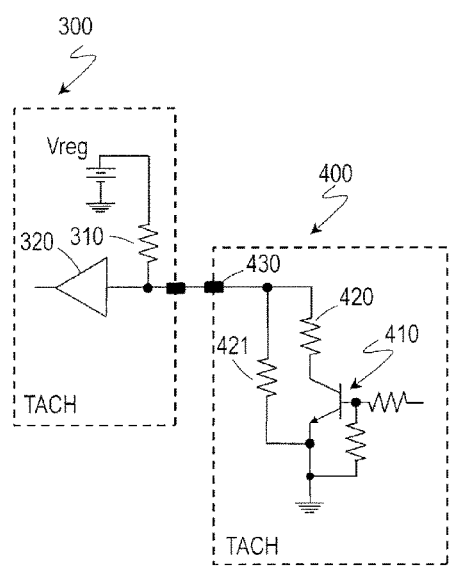
[Fig. 15A]

[Fig. 1 5 B]
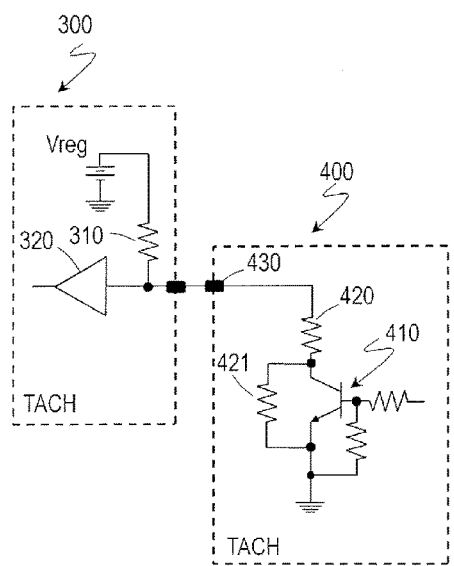

BRUSHLESS DC MOTOR, AND IDENTIFICATION METHOD AND IDENTIFICATION APPARATUS OF IDENTIFYING TYPE OF BRUSHLESS DC MOTOR

CROSS REFERENCE TO RELATED APPLICATIONS

This application claims the benefit of priority to Japanese Patent Application No. 2017-091266 filed on May 1, 2017 and Japanese Patent Application No. 2017-172841 filed on Sep. 8, 2017. The entire contents of these applications are hereby incorporated herein by reference.

BACKGROUND OF THE INVENTION

1. Field of the Invention

The present disclosure relates to a brushless DC motor, and an identification method and an identification apparatus of identifying a type of brushless DC motor.

2. Description of the Related Art

A large number of electronic apparatuses are equipped with, for example, fan motors as cooling devices for releasing heat generated inside to the outside. In the electronic apparatus, the fan motor is electrically connected to a system controller, and operates under the control of the system controller.

US Laid-open Patent Publication No. 2006/0152891 discloses an identification method of allowing a system controller to acquire fan identification information through communications with a fan motor. For example, upon switching from a normal operating mode to a command mode, the fan motor and the system controller exchange commands via a power supply line, a pulse width modulation (PWM) line, and a tachometer (TACH) line. The system controller acquires the fan identification information by handshaking, and determines the compatibility of the fan motor. In this case, both of the system controller and the fan need to be equipped with complicated software for operations such as switching between the normal operating mode and the command mode.

With regard to the above conventional technique, there has been a demand for a method of more easily identifying each of types of brushless DC motors.

SUMMARY OF THE INVENTION

An embodiment of the present disclosure provides a brushless DC motor identification method and an identification apparatus that are capable of identifying types of brushless DC motors without performing handshaking in particular.

An exemplary identification method of the present disclosure is an identification method for use in an identification apparatus that identifies a type of brushless DC motor. The brushless DC motor includes a circuit board on which at least one terminal with an open-collector or open-drain output function is mounted. The at least one terminal includes at least one specific resistance out of a first specific resistance electrically connected in series between an open-collector or open-drain switching element and a pin of the at least one terminal, and a second specific resistance electrically connected in parallel to the switching element. The first specific resistances and the second specific resistances vary among a plurality of types of brushless DC motors. The identification method comprises: supplying a power supply voltage from the identification apparatus to the brushless DC motor; supplying a voltage to a signal line of the at least one terminal of the circuit board via a pull-up resistance in the identification apparatus; inputting an identification voltage value to the identification apparatus, the identification voltage value set by the at least one specific resistance and outputted from the at least one terminal; and identifying a type of the brushless DC motor based on the identification voltage value.

An exemplary identification apparatus of the present disclosure is an identification apparatus that identifies a type of brushless DC motor. The brushless DC motor includes a circuit board on which at least one terminal with an open-collector or open-drain output function is mounted. The at least one terminal includes at least one specific resistance out of a first specific resistance electrically connected in series between an open-collector or open-drain switching element and a pin of the at least one terminal, and a second specific resistance electrically connected in parallel to the switching element. The first specific resistances and the second specific resistances vary among a plurality of types of brushless DC motors. The identification apparatus includes: a power supply terminal that supplies a power supply voltage to the brushless DC motor; an input terminal that is electrically connected to the at least one terminal of the circuit board, and that includes a pull-up resistance incorporated therein; and a controller that identifies a type of the brushless DC motor. The controller acquires, via the input terminal, an identification voltage value set by the at least one specific resistance and outputted from the at least one terminal of the circuit board when the power supply voltage is supplied to the brushless DC motor via the power supply terminal and the pull-up resistance is pulled up. The controller identifies the type of the brushless DC motor based on the identification voltage value.

An exemplary brushless DC motor of the present disclosure includes: a circuit board; at least one terminal that has an open-collector or open-drain output function and that is mounted on the circuit board; a coil; and a drive circuit that causes electricity to flow through the coil. The at least one terminal includes at least one specific resistance out of a first specific resistance electrically connected in series between an open-collector or open-drain switching element and a pin of the at least one terminal, and a second specific resistance electrically connected in parallel to the switching element. The first specific resistances and the second specific resistances vary among a plurality of types of brushless DC motors.

According to the exemplary embodiments of the present disclosure, brushless DC motors are equipped with specific resistances that vary among the types of brushless DC motors, and the identification voltage value set by the specific resistance is inputted to the identification apparatus. This makes it possible to provide a brushless DC motor identification method and identification apparatus that are capable of identifying types of brushless DC motors without performing handshaking in particular.

The above and other elements, features, steps, characteristics and advantages of the present discloser will become more apparent from the following detailed description of the preferred embodiments with reference to the attached drawings.

BRIEF DESCRIPTION OF THE DRAWINGS

FIG. 1 is a block diagram schematically illustrating a typical block configuration example of a user system and a brushless DC motor according to exemplary Embodiment 1.

FIG. 2 is a circuit diagram illustrating circuit configurations of TACH terminals of the user system and the brushless DC motor;

FIG. 3 is a block diagram schematically illustrating another block configuration example of the user system and the brushless DC motor according to exemplary Embodiment 1.

FIG. 4 is a flowchart illustrating an identification method of identifying a type of brushless DC motor according to exemplary Embodiment 1.

FIG. 5 is a flowchart illustrating a specific processing flow in step S300 of identifying a type of brushless DC motor based on an identification voltage value.

FIG. 6 is a schematic diagram illustrating contents in a table used for identification.

FIG. 7 is a flowchart illustrating another example of a specific processing flow in step S300 of identifying a type of brushless DC motor based on an identification voltage value.

FIG. 8 is a circuit diagram illustrating an implementation example of a circuit configuration of a comparator.

FIG. 9 is a graph presenting output waveforms for explaining an operation of the comparator.

FIG. 10 is a flowchart illustrating another specific example of the identification method of identifying a type of brushless DC motor according to exemplary Embodiment 1.

FIG. 11 is a block diagram schematically illustrating a typical block configuration example of a user system, an identification apparatus, and a brushless DC motor according to exemplary Embodiment 2.

FIG. 12 is a block diagram schematically illustrating another block configuration example of the user system, the identification apparatus, and the brushless DC motor according to exemplary Embodiment 2.

FIG. 13 is a circuit diagram illustrating circuit configurations of TACH terminals of a user system and a brushless DC motor according to exemplary Embodiment 3.

FIG. 14 is a graph presenting output waveforms for explaining an operation of the comparator.

FIG. 15A is a circuit diagram illustrating a variation of the circuit configurations of the TACH terminals of the user system and the brushless DC motor according to exemplary Embodiment 3.

FIG. 15B is a circuit diagram illustrating a variation of the circuit configurations of the TACH terminals of the user system and the brushless DC motor according to exemplary Embodiment 3.

DETAILED DESCRIPTION OF THE PREFERRED EMBODIMENTS

Hereinafter, with reference to the accompanying drawings, detailed description is provided for embodiments of an identification method and an identification apparatus of identifying types of brushless DC motors according to the present disclosure. In order to prevent unnecessarily redundant description from being provided below and to facilitate the understanding by those skilled in the art, description detailed more than necessarily may be omitted for some matters. For example, detailed explanation of well-known matters and repetitive description of substantially the same configurations are omitted in some cases.

FIG. 1 schematically illustrates a typical block configuration example of a user system 100 and a brushless DC motor 200 according to Embodiment 1. In the present specification, the configuration and operations of the brushless DC motor 200 are described by taking a fan motor as an example. Brushless DC motors of the present disclosure include a motor of an inner rotor type or an outer rotor-type motor. The brushless DC motor 200 is not limited to the fan motor, but may be any of brushless DC motors for use for various purposes. The brushless DC motor 200 is, for example, a motor used for a home appliance such as an air conditioner or a washing machine, or an in-vehicle motor.

The user system 100 is electrically connected to the brushless DC motor 200. The user system 100 is capable of controlling the brushless DC motor 200. The user system 100 may be mounted on a management system for brushless DC motor manufacturing in a factory where a wide variety of motors are manufactured. Instead, the user system 100 may be a system in an electronic apparatus or be an in-vehicle system, in which the brushless DC motor 200 is installable. For example, the brushless DC motor 200 is favorably mounted in an electronic apparatus such as a server, a main body of a desktop type personal computer, or a game device. For example, when brushless DC motors 200 under different specifications are manufactured in the same location, the user system 100 is a part of a series of inspection systems. Instead, when the brushless DC motor 200 is mounted as a fan motor in a server or a main body of a desktop type personal computer, for example, the user system 100 is the whole or a part of a system composed of various electronic components mounted on the mother board.

The user system 100 includes, for example, a controller 110 and a memory 120. The user system 100 according to the present embodiment has a function to identify types of brushless DC motors 200 as described later. In other words, the user system 100 is usable as an identification apparatus that identifies types of brushless DC motors 200. For this reason, in the present specification, the user system 100 is also referred to as an identification apparatus 100 in some cases.

The controller 110 is capable of controlling the whole of the user system 100 and the brushless DC motor 200. The controller 110 is further capable of identifying a type of the brushless DC motor 200. The controller 110 is a semiconductor integrated circuit such, for example, as a micro control unit (MCU) or a field programmable gate array (FPGA).

The memory 120 is, for example, a writable memory (for example a PROM), a rewritable memory (for example, a flash memory), or a read-only memory. The memory 120 stores a control program containing a group of commands causing the controller 110 to control the brushless DC motor 200. The memory 120 further stores a control program containing a group of commands causing the controller 110 to identify types of brushless DC motors 200. For example, these control programs are once loaded on a RAM (not illustrated) during booting. Note that the memory 120 does not have to be an external memory connected to the controller 110, but may be mounted in the controller 110. The controller 110 in which the memory 120 is mounted is, for example, an MCU mentioned above.

The user system 100 includes terminals for controlling the brushless DC motor 200, called, for example, a Vmot terminal, a PWM terminal, a TACH terminal, and a GND terminal. The user system 100 may optionally include an SDATA terminal, an SCLK terminal, a DIRout terminal to control the rotation direction of the motor, a START/STOP terminal to instruct the motor to start or stop rotating, and so on. In the present embodiment, the rotation of the motor means the rotation of the fan motor (or the fan).

The Vmot terminal is a terminal for a motor power supply. For example, a power supply voltage at 52 V is supplied from the Vmot terminal to the brushless DC motor 200.

The PWM terminal is an output terminal to control the number of rotations of the motor. The controller 110 generates a PWM signal to control the rotations of the motor, and outputs the PWM signal to the brushless DC motor 200 through the PWM terminal.

The TACH terminal is an input terminal for tachometer to monitor the rotational speed of the motor. The rotational speed is expressed as the number of rotations (rpm) at which the motor rotates per unit time (one minute) or the number of rotations (rps) at which the motor rotates per unit time (one second). For example, the TACH terminal of the fan motor generally outputs two pulses per rotation of the motor. A pulse signal outputted according to the rotational speed of the motor from the TACH terminal of the brushless DC motor 200 is inputted to a TACH terminal of the user system 100.

The SDATA terminal and the SCLK terminal are input/output terminals for performing I2C communications. The SDATA terminal and the SCLK terminal are not indispensable terminals. The user system 100 and the brushless DC motor 200 are enabled to perform serial communications therebetween through the SDATA terminals and the SCLK terminals.

The brushless DC motor 200 is, for example, a DC fan including an impeller. The brushless DC motor 200 is, for example, an axial fan, a centrifugal fan, a cross-flow fan, or a sirocco fan. The brushless DC motor 200 typically includes a regulator 210, a motor drive IC 220, an inverter 230, a circuit board CB on which these electronic components are mounted, a coil 240, and a Hall element 260. For example, the regulator 210, the motor drive IC 220, the inverter 230, and the Hall element 260 constitute a drive circuit that drives the motor by causing electricity to flow through the coil 240.

The regulator 210 lowers the motor power supply voltage at 52 V, for example, to generate a power supply voltage Vcc (for example, 5 V) for the motor drive IC 220. Here, the regulator 210 is not indispensable. Instead, for example, in addition to a motor power supply voltage Vmot, a power supply voltage Vcc may be supplied from the user system 100 to the brushless DC motor 200 as described later.

The motor drive IC 220 is connected to the inverter 230. The motor drive IC 220 generates a control signal to control the inverter 230, in accordance with the PWM signal transmitted from the user system 100. The motor drive IC 220 includes an SDATA terminal and an SCLK terminal, and is capable of performing I2C communications with the user system 100.

The motor drive IC 220 monitors the rotational speed of the motor based on outputs from the Hall element 260, and generates a pulse signal according to the rotational speed of the motor, for example. The output method is, for example, to output two pulses per rotation. In this connection, a technique of generating a TACH signal without using a Hall element has been known. In the case of using such a technique, the Hall element 260 is not needed.

The inverter 230 is electrically connected to the motor drive IC 220 and the coil 240 of the motor. The inverter 230 converts the power of the motor power supply to the power to be supplied to the fan motor, and causes the obtained power to flow into the coil 240.

The coil 240 is a winding of the motor.

The brushless DC motor 200 includes a circuit board CB on which, for example, a Vmot terminal, a PWM terminal, an SDATA terminal, an SCLK terminal, a TACH terminal, and a GND terminal respectively corresponding to the terminals of the user system 100 are mounted.

In the brushless DC motor 200, the PWM terminal is an input terminal, whereas the TACH terminal is an output terminal.

FIG. 2 schematically illustrates circuit configurations of the TACH terminals of the user system 100 and the brushless DC motor 200.

The TACH terminal 300 of the user system 100 is an input terminal. The TACH terminal 300 includes, for example, a pull-up resistance 310 and a buffer 320. The pull-up resistance 310 has a resistance value Rpu in the order of dozen kΩ, which is, for example, 10 kΩ. The pull-up voltage Vreg is, for example, 5 V.

The TACH terminal 400 of the brushless DC motor is an output terminal. The output method of the TACH terminal 400 is an open collector or an open drain. The TACH terminal 400 includes an open-collector or open-drain switching element 410, and a specific resistance 420. The open-collector switching element is a bipolar transistor, whereas the open-drain switching element is a unipolar transistor. FIG. 2 illustrates the open-collector switching element 410 as an example. The specific resistance 420 is electrically connected in series between the open-collector terminal and a pin 430.

The specific resistance 420 is a resistance for identifying a brushless DC motor. The specific resistances 420 vary among multiple types of brushless DC motors. For example, a resistance value Rid of the specific resistance 420 may be exclusively allocated to each of suppliers that manufacture brushless DC motors. For example, it is possible to allocate a specific resistance 420 at 2.5 kΩ, to a supplier A, and allocate a specific resistance 420 at 1.36 kΩ, to a supplier B. Then, it is possible to allocate a specific resistance 420 having a resistance value Rid different from the above values to a supplier C. Moreover, it is possible to allocate specific resistances 420 having resistance values Rid different from the above values to multiple suppliers, respectively.

As another example, it is possible to exclusively allocate a resistance value Rid of a specific resistance 420 to each product lot. For example, it is possible to allocate a specific resistance 420 at 2.5 kΩ to a product lot number A, and allocate a specific resistance 420 at 1.36 kΩ to a product lot number B. Then, it is possible to allocate a specific resistance 420 having a resistance value Rid different from the above values to a product lot number C. Moreover, it is possible to allocate specific resistances 420 having resistance values Rid different from the above values to multiple product lot numbers, respectively. In this way, the number of multiple types of brushless DC motors existing is equal to the number of suppliers or the number of product lots to be managed, for example.

A voltage level of the output signal outputted from the TACH terminal 400 of the brushless DC motor 200 is set by the resistance value Rid of the specific resistance 420. In other words, the voltage level is given by a function of the resistance value Rid. When the switching element 410 is turned on while the pull-up resistance 310 having the resistance value Rpu is pulled up, an output signal Vlow at a low voltage level represented by Formula (1) is outputted.

The identification apparatus 100 can identify the type of brushless DC motor 200 by measuring the output signal Vlow.

$$Vlow = Vreg \times [Rid/(Rpu+Rid)] \quad \text{Formula (1)}$$

FIG. 3 schematically illustrates another block configuration example of the user system 100 and the brushless DC motor 200.

The user system 100 may further include, for example, multiple light emitted diodes (LED) 130 as light emitters. The multiple LEDs 130 constitute a notification device that provides a notification of an identification result of the type of brushless DC motor 200. For example, the number of LEDs 130 provided may be equal to the number of types of brushless DC motors. If there are two types of brushless DC motors of the suppliers A and B, for example, two LEDs having emitted light of different colors, for example, may be provided. For example, it is possible to use a red LED for the supplier A, and a blue LED for the supplier B. The user system 100 may further include a comparator 500 to be described later.

The brushless DC motor 200 may include an MCU 250. Equipped with the MCU 250, the brushless DC motor 200 can be made intelligent. For example, the MCU 250 enables direct control of the motor drive IC 220. In addition, as described above, the brushless DC motor 200 does not have to include the regulator 210. In this case, for example, the power supply voltage Vcc for the motor drive IC 220 is supplied from the user system 100.

The brushless DC motor 200 may further include a DIRout terminal that indicates a rotation direction. The DIRout terminal of the user system 100 is generally an output terminal with an open-collector or open-drain output function.

FIG. 4 illustrates a flowchart of an identification method of identifying a type of brushless DC motor.

The identification method according to the present embodiment is, for example, a method used in the identification apparatus 100. In general, each of processes of manufacturing a wide variety of products equipped with motors requires identification of types of brushless DC motors 200 in order to prevent different types of motors from being included into the process. For example, the identification method of the present disclosure is advantageously applied to a method of inspecting the compatibility of a brushless DC motor 200 with the user system 100 during product manufacturing in a factory. For example, the process of inspecting the compatibility of a brushless DC motor 200 is one of product manufacturing processes.

(Step S100) First, in the state where the terminals of the identification apparatus 100 (user system 100) and the brushless DC motor 200 are electrically connected to each other, the identification apparatus 100 supplies a motor power supply voltage Vmot to the brushless DC motor 200. Instead, in the configuration example illustrated in FIG. 3, the identification apparatus 100 may supply the brushless DC motor 200 with a power supply voltage Vcc for the motor drive IC 220 together with the motor power supply voltage Vmot. For example, upon input of the power supply, the electronic components in the brushless DC motor 200 perform an initialization operation such as a reset operation. After the completion of the initialization operation, the regulator 210, the motor drive IC 220, and the inverter 230 are supplied with the stable power supply voltages.

The pull-up resistance 310 in the TACH terminal 300 of the identification apparatus 100 is pulled up at the pull-up voltage Vreg, and the pull-up voltage Vreg is supplied to the TACH signal line via the pull-up resistance 310. With this, in the TACH terminal 400 of the brushless DC motor 200, the TACH signal line is kept at a high voltage level while the switching element 410 is off.

(Step S200) The identification voltage value set by the specific resistance and outputted from at least one of the terminals of the brushless DC motor 200 is inputted to the identification apparatus 100. In the present embodiment, the identification voltage value set by the specific resistance 420 and outputted from the TACH terminal 400 in the brushless DC motor 200 is inputted to the identification apparatus 100. The output terminal from which the identification voltage value is outputted is not limited to the TACH terminal, but may be any output terminal with an open-collector or open-drain output function.

Unless the switching element 410 (see FIG. 3) in the TACH terminal 400 is turned on, the brushless DC motor 200 does not output the output signal Vlow from the TACH terminal 400. For this reason, the identification apparatus 100 (mainly the controller 110) outputs, for example, a PWM signal to the motor drive IC 220. The PWM signal causes the motor to make just two rotations. Upon receipt of the PWM signal, the motor drive IC 220 controls the inverter 230 and causes the motor to make just two rotations. Thus, the identification apparatus 100 can acquire the identification voltage value outputted with driving of the brushless DC motor 200.

Here, refer to FIG. 2 again. The switching element 410 in the TACH terminal 400 is turned on and off in accordance with a pulse signal generated with the rotations of the motor. More specifically, while the pull-up resistance 310 in the TACH terminal 300 of the identification apparatus 100 is pulled up at the pull-up voltage Vreg, the switching element 410 is turned on and off according to the number of rotations of the motor.

When the pulse signal is at a low level, in other words, when the switching element 410 is off, the TACH signal is at a high level. When the pulse signal is turned to a high level, the switching element 410 is turned on and the TACH terminal 400 outputs the output signal Vlow as the identification voltage value. Multiple types of brushless DC motors are configured to output mutually different output signals Vlow respectively depending on the resistance values Rid of the specific resistances 420. A designer can determine what level is set for each of the output signals Vlow by taking into account the product specifications and others.

In another example, the output signal Vlow may be obtained by directly controlling the on and off of the switching element 410 without rotating the motor. For example, an identification period for identifying a type of brushless DC motor 200 is provided after the start of supply of the power supply voltage to the brushless DC motor 200. For the identification period, the MCU 250 (see FIG. 3) generates a signal which causes the switching element 410 to switch on and off at a predetermined duty ratio, and forcibly gives the signal to the switching element 410. In other words, the MCU 250 can generate a dummy signal that is the same as the pulse signal generated according to the number of rotations of the motor, and forcibly give the signal to the switching element 410. The identification period may be set, for example, in the order of several seconds. The identification apparatus 100 may acquire, as the identification voltage value, the output signal Vlow outputted by forcibly switching the switching element 410 as described above. The predetermined duty ratio of the switching is, for example, 50%.

(Step S300) The identification apparatus 100 receives the output signal Vlow as the identification voltage value. The identification apparatus 100 identifies a type of brushless DC motor 200 based on the identification voltage value.

FIG. 5 illustrates an example of a specific processing flow in step S300 of identifying a type of brushless DC motor 200 based on an identification voltage value.

(Step S310A) In the example in FIG. 5, the identification apparatus 100 obtains a unique information piece by AD conversion of the identification voltage. For example, the controller 110 of the identification apparatus 100 is capable of performing AD conversion. The controller 110 converts the identification voltage that is an analog signal into a digital signal. In the present specification, the digital signal obtained by the AD conversion is referred to as a unique information piece of the brushless DC motor 200. The resolution of the AD conversion is 10 bits, for example.

(Step S320A) The controller 110 of the identification apparatus 100 can identify the type of brushless DC motor 200 to be identified based on the obtained unique information piece by referring to a table. FIG. 6 illustrates contents in a table used for identification. The table is a lookup table (LUT) in which multiple types of brushless DC motors are associated with multiple unique information pieces of brushless DC motors. The table is stored in the memory 120, for example. As described above, the multiple types of brushless DC motors are present for the respective suppliers, for example, and there are three types of the suppliers A, B and C, for example. For example, a type of motor may be expressed with a 3-bit digital signal. Each of the unique information pieces may be expressed by a digital value with the same bit width as the resolution of the AD conversion.

Multiple unique information pieces of brushless DC motors are allocated to multiple types of brushless DC motors. When the resistance value Rpu of the pull-up resistance 310 is set to 10 kΩ and the pull-up voltage Vreg is set to 5 V, for example, a specific resistance 420 having 2.5 kΩ with which an output signal Vlow at 1.0 V is obtained may be allocated to the supplier A, for example. For example, a specific resistance 420 having 1.36 kΩ with which an output signal Vlow at 0.6 V is obtained may be allocated to the supplier B. For example, a specific resistance 420 having 0.87 kΩ with which an output signal Vlow at 0.4 V is obtained may be allocated to the supplier C.

Each of the multiple unique information pieces of brushless DC motors has a digital value obtained by AD conversion. FIG. 6 illustrates a range and identification of each set of unique information pieces. The unique information pieces obtained by the AD conversion do not have overlap among the types of brushless DC motors.

According to the method of creating the table in the present embodiment, each type of brushless DC motor 200 can be appropriately associated with unique information pieces in the table. This enables identification of a type of brushless DC motor 200 with an allowable margin given to a digital value obtained for the identification.

As another method of identifying a type of brushless DC motor 200, there is an identification method using a comparator in place of the AD conversion.

FIG. 7 illustrates another example of a specific processing flow in step S300 of identifying a type of brushless DC motor 200 based on an identification voltage value. FIG. 8 schematically illustrates an implementation example of a circuit configuration of the comparator 500. FIG. 9 presents output waveforms for explaining an operation by the comparator 500.

The comparator 500 includes four detectors 510, 520, 530, and 540. In this example, there are four types of brushless DC motors 200 (for example, suppliers A, B, C, and D). For example, the detector 510 is for the supplier A. The detector 520 is for the supplier B. The detector 530 is for the supplier C. The detector 540 is for the supplier D.

Each of the detectors includes an operational amplifier AMP, and resistors R1, R2, and R3. For example, the resistance values of the resistors R1, R3 are about 10 kΩ. A power supply voltage V1 of the operational amplifier AMP is, for example, 5 V. A pull-up voltage V2 of the resistor R3 is, for example, 5 V. Each of the detectors is preferably a hysteresis comparator.

The four detectors 510, 520, 530, and 540 are different from each other in the resistance value of the resistor R2. In other words, the resistance values of the resistors R2 vary among the multiple types of brushless DC motors. For example, 3.16 kΩ may be allocated to the resistance value of the resistor R2 in the detector 510. For example, 1.90 kΩ may be allocated to the resistance value of the resistor R2 in the detector 520. For example, 1.11 kΩ may be allocated to the resistance value of the resistor R2 in the detector 530. For example, 0.64 kΩ may be allocated to the resistance value of the resistor R2 in the detector 540.

Among the four detectors 510, 520, 530 and 540, the reference voltages Vref for the operational amplifiers AMP vary with the different resistance values exclusively allocated to the resistors R2. This resultantly enables adjustment of a voltage input level with which each detector can react. Multiple reference voltages Vref are allocated to the respective types of brushless DC motors.

(Step S310B) The identification voltage value received from the brushless DC motor 200 and the multiple reference voltages Vref are inputted to the comparator 500 to obtain a comparison result.

Each operational amplifier AMP outputs an output signal OUT depending on which one is higher between the input voltage and the corresponding reference voltage Vref. When the input voltage is equal to or lower than the reference voltage Vref, the operational amplifier AMP outputs a signal at a low level. When the input voltage is higher than the reference voltage Vref, the operational amplifier AMP outputs a signal at a high level.

(Step S320B) In the present embodiment, a reference voltage Vref4 for the detector 510 is, for example, 1.2 V. A reference voltage Vref3 for the detector 520 is, for example, 0.8 V. A reference voltage Vref2 for the detector 530 is, for example, 0.5 V. A reference voltage Vref1 for the detector 540 is, for example, 0.3 V. For example, with an input voltage at 0.6 V from a brushless DC motor of the supplier B, the detectors 530, 540 react but the detectors 510, 520 do not react. A comparison result obtained from the input voltage at 0.6 V includes OUT1, OUT2 at the low level and OUT3, OUT4 at the high level. The controller 110 can identify the brushless DC motor to be identified as the supplier B type based on this comparison result. The OUT1, OUT2, OUT3, and OUT4 denote output signals outputted from the detectors 510, 520, 530, and 540, respectively.

For example, if the OUT1, OUT2, and OUT3 are at the low level while the OUT4 is at the high level, the controller 110 can identify the supplier C type based on this comparison result. For example, if the OUT1 is at the low level while the OUT2, OUT3 and OUT4 are at the high level, the controller 110 can identify the supplier A type based on this comparison result. For example, if all the OUT1, OUT2, OUT3 and OUT4 are at the high level, the controller 110 cannot identify any of the supplier types based on this comparison result, but thereby can detect that no brushless DC motor is connected.

FIG. 10 illustrates another specific example of a flowchart of the identification method of identifying a type of brushless DC motor 200.

As illustrated in FIG. 10, the identification method according to the present embodiment may further include a step of providing a notification of an identification result of the type of brushless DC motor 200 (S400).

As one example of a notification method, the multiple light emitters illustrated in FIG. 3, for example, the multiple LEDs 130 may be used to provide a notification of an identification result of the type of brushless DC motor 200. Based on the identification result of the type of brushless DC motor 200, the controller 110 of the identification apparatus 100 selects the LED 130 allocated to the brushless DC motor 200 to be identified from among the multiple LEDs 130 allocated to the respective types of brushless DC motors, and causes the selected LED 130 to emit light. Incidentally, the light emitter is not limited to an LED, but may be any element capable of providing a notification by using light.

For example, a red LED may be allocated for the supplier A, a blue LED may be allocated for the supplier B, and a green LED may be allocated for the supplier C. When identifying the brushless DC motor of the supplier C, the controller 110 of the identification apparatus 100 can cause the green LED to emit light. With this, an operator in a factory, for example, can visually recognize whether or not the brushless DC motor to be identified is the motor of the supplier C.

As another example, when the outputs OUT1, OUT2, OUT3, and OUT4 from the comparator 500 may be electrically connected to the LEDs via semiconductor open-collector switching elements, a predetermined number of the LEDs may be caused to emit light depending on the signal levels of the outputs OUT. For example, an operator can visually recognize the type of brushless DC motor 200 from a combination of LEDs 130 emitting light among the multiple LEDs 130.

As another example, a display device (for example, a liquid crystal display), a speaker, or the like may be used to provide a notification of an identification result of the type of brushless DC motor 200. For example, the identification result may be displayed as text information on the liquid crystal display. For example, the speaker may make a sound from among sounds different in pitch among the types of brushless DC motors.

As another example, the controller 110 of the identification apparatus 100 may once write the identification result to the memory 120, or transmit the identification result to another apparatus or device that needs the identification result. These modes are also examples of the identification result notification.

According to the present embodiment, when a brushless DC motor 200 is powered on, for example, the identification voltage value set by the specific resistance 420 is automatically outputted from the TACH terminal. The identification apparatus 100 only has to receive the outputted identification voltage value. There is no need to perform the conventionally necessary operations such as communications by handshaking between the identification apparatus 100 and the brushless DC motor 200 or a mode switching of the brushless DC motor 200. In addition, the method can use the existing terminal and does not need new provision of a terminal dedicated to the identification.

For example, the brushless DC motor 200 may further include an output terminal with an open-collector or open-drain output function, in addition to the TACH terminal. For example, the DIRout terminal illustrated in FIG. 3 may be equipped with another specific resistance as in the TACH terminal. The identification voltage values outputted from the TACH terminal and the DIRout terminal are inputted to the identification apparatus 100. For example, the identification apparatus 100 may perform AD conversion of each of the two identification voltage values to obtain one of three unique information pieces, and identify the type of brushless DC motor 200 based on the obtained combination of the unique information pieces among all the combinations of the three unique information pieces. Use of two terminals enables identification of 9 types of motors. For example, use of three terminals enables identification of 27 types of motors. In this way, an increase in the number of terminals used for the identification can lead to an increase in the number of identifiable types of motors.

The identification method of the present disclosure may be also advantageously used not only in product manufacturing processes but also in other processes such, for example, as one to replace a brushless DC motor having a failure with a new one. It is possible to confirm whether the new brushless DC motor after the replacement is compatible with the system or not. Moreover, for example, products equipped with brushless DC motors are connected to the Internet. In this case, what is termed Internet of Things (IoT) is established. For example, each of the suppliers of the products equipped with brushless DC motors can identify the product equipped with a particular brushless DC motor by analyzing big data including the unique information pieces of brushless DC motors. This enables quality stabilization by preventing the occurrence of a trouble or doing the like.

FIG. 11 schematically illustrates a typical block configuration example of a user system 100, an identification apparatus 100A, and a brushless DC motor 200 according to Embodiment 2.

The identification apparatus 100A according to the present embodiment is an apparatus separated from the user system 100 unlike Embodiment 1. The identification apparatus 100A includes, for example, an MCU 110A and an LED 130. The identification apparatus 100A includes, for example, a Vmot terminal, a GND terminal, and a TACH terminal as terminals necessary for identifying types of brushless DC motors 200. The identification apparatus 100A may further include a PWM terminal.

The user system 100, the identification apparatus 100A, and the brushless DC motor 200 are electrically connected to each other via the Vmot terminals, the GND terminals, and the TACH terminals. Thus, any one of the user system 100 and the identification apparatus 100A can supply a power supply voltage to the brushless DC motor 200 via the Vmot terminals. A PWM signal can be transmitted from the user system 100 to the brushless DC motor 200.

The identification apparatus 100A may further include the PWM terminal. In place of the user system 100, the MCU 110A of the identification apparatus 100A may generate a PWM signal for causing the brushless DC motor 200 to rotate and provide the PWM signal to the brushless DC motor 200.

Upon power-on, an identification voltage value outputted from the TACH terminal 400 is inputted to the TACH terminal of the identification apparatus 100A. For example, the MCU 110A can identify the type of brushless DC motor 200 based on the acquired identification voltage value in accordance with the processing flow illustrated in FIG. 5. Moreover, the MCU 110A may transmit the identification result to the controller 110 of the user system 100.

FIG. 12 schematically illustrates another block configuration example of the user system 100, the identification apparatus 100A, and the brushless DC motor 200.

The identification apparatus 100A is electrically connected to the user system 100 and the brushless DC motor 200 via, for example, test points (TP). TP1 is a TP for motor power supply. TP2 is a TP for TACH signal. TP3 is a TP for GND. A special-purpose probe is connected to the identification apparatus 100A, and a type of brushless DC motor 200 can be identified by bringing the probe into contact with the TPs.

In Embodiment 1, the TACH terminal 400 is explained in which the specific resistance 420 for identifying a brushless DC motor is connected in series to the switching element 410. The present disclosure is not limited to this configuration, but the TACH terminal 400 may include a specific resistance 421 connected in parallel to the switching element 410.

FIG. 13 schematically illustrates circuit configurations of the TACH terminals of the user system 100 and the brushless DC motor 200 according to Embodiment 3. Hereinafter, description is provided mainly for different points from the TACH terminal 400 in Embodiment 1.

The specific resistance 421 is connected in parallel to the switching element 410. The specific resistance 421 is a resistance for identifying a brushless DC motor, and the specific resistances 421 vary among multiple types of brushless DC motors as in Embodiment 1. A resistance value Rid of the specific resistance 421 is higher than a resistance value Rpu of the pull-up resistance 310. For example, a resistance value Rid of the specific resistance 421 may be exclusively allocated to each of suppliers that manufacture brushless DC motors. For example, it is possible to allocate a specific resistance 421 at 17.8 kΩ to a supplier A, allocate a specific resistance 421 at 15.0 kΩ to a supplier B, allocate a specific resistance 421 at 12.7 kΩ to a supplier C, and allocate a specific resistance 421 at 10.8 kΩ to a supplier D. For example, these resistance values Rid of the specific resistances 421 can be used for the TACH terminal 300 of the identification apparatus 100 under the conditions in which the resistance value of the pull-up resistance 310 is set to 10 kΩ and the pull-up voltage Vreg is set to 5 V.

A voltage level of the output signal outputted from the TACH terminal 400 of the brushless DC motor 200 is set by the resistance value Rid of the specific resistance 421 as in Embodiment 1. In other words, the voltage level is given by a function of the resistance value Rid. When the switching element 410 is turned off while the pull-up resistance 310 is pulled up, an output signal Voh at a high voltage level represented by Formula (2) is outputted. Since the resistance value Rid of the specific resistance 421 is higher than the resistance value Rpu of the pull-up resistance 310, the voltage level of the output signal is relatively high. The identification apparatus 100 can identify the type of brushless DC motor 200 by measuring the output signal Voh.

$$Voh = Vreg \times [Rid/(Rpu+Rid)] \quad \text{Formula (2)}$$

FIG. 14 presents output waveforms for explaining an operation by the comparator 500. As explained for the detection of the identification voltage value at the low level with reference to FIG. 9, for example, a comparator 500 may be used to detect the identification voltage value at the high level.

For example, 5.1 kΩ may be allocated to the resistance value of the resistor R1 in the detector 510. For example, 6.1 kΩ may be allocated to the resistance value of the resistor R1 in the detector 520. For example, 7.2 kΩ may be allocated to the resistance value of the resistor R1 in the detector 530. For example, 8.5 kΩ may be allocated to the resistance value of the resistor R1 in the detector 540. In this way, the resistance values of the resistors R1 vary among the multiple types of brushless DC motors. For example, these resistance values of the resistors R1 may be used in the respective detectors 510 to 540 of the comparator 500 each under the conditions in which the resistance value of the resistor R2 is set to 10 kΩ and the pull-up voltage V2 is set to 5 V.

FIGS. 15A, 15B schematically illustrate variations of circuit configurations of the TACH terminals of the user system 100 and the brushless DC motor 200 according to the present embodiment.

The TACH terminal 400 according to each of the present variations includes two specific resistances 420, 421. In some cases, the specific resistance 420 is referred to as a first specific resistance, and the specific resistance 421 is referred to as a second specific resistance. The TACH terminal 400 illustrated in FIG. 15A includes the specific resistance 420 connected between the open-collector terminal and the pin 430, and the specific resistance 421 electrically connected in parallel to the switching element 410 and the specific resistance 420. The TACH terminal 400 illustrated in FIG. 15B includes the specific resistance 420 connected between the open-collector terminal and the pin 430, and the specific resistance 421 electrically connected in parallel to the switching element 410 and electrically connected in series to the specific resistance 420.

A resistance value Rpu of the pull-up resistance 310 is higher than a resistance value Rid of the specific resistance 420, and a resistance value Rid of the specific resistance 421 is higher than the resistance value Rpu. The resistance value Rid of the specific resistance 421 is the highest among the resistance values of the pull-up resistance 310 and the specific resistances 420 and 421.

When the switching element 410 is turned on with the pull-up resistance 310 pulled up, the voltage level of the output signal outputted from the TACH terminal 400 is the low voltage level Vlow expressed by Formula (1) as described in Embodiment 1. On the other hand, when the switching element 410 is turned off with the pull-up resistance 310 pulled up, the voltage level of the output signal outputted from the TACH terminal 400 is the high voltage level Voh expressed by Formula (2).

According to the present variations, the identification apparatus 100 may identify a type of motor based on the two output signals Vlow and Voh assigned with certain meanings. From combinations of the output signals Vlow and Voh, the identification apparatus 100 is enabled to identify a larger number of types of brushless DC motors 200. For example, if four resistance values Rid are allocated to the specific resistances 420 and four resistance values Rid are allocated to the specific resistances 421, 16 types of brushless DC motors 200 can be identified.

General description of an embodiment of the present disclosure is provided below.

An identification method according to an exemplary embodiment of the present disclosure is an identification method for use in, for example, an identification apparatus 100 that identifies types of brushless DC motors 200. For example, as described with reference to FIGS. 1 and 2, each brushless DC motor 200 includes a circuit board CB on which at least one terminal with an open-collector or open-drain output function, for example, a TACH terminal 400 is mounted. The at least one terminal includes at least one specific resistance out of a specific resistance 420 electrically connected in series between an open-collector or open-drain switching element 410 and a pin 430 of the terminal, and a specific resistance 421 electrically connected in parallel to the switching element 410. The specific resistances 420 and the specific resistances 421 vary among multiple types of brushless DC motors. For example as described with reference to FIG. 4, the identification method includes: supplying a power supply voltage from the identification apparatus 100 to the brushless DC motor 200; supplying a voltage Vreg to a signal line of the TACH terminal 400 of the circuit board CB via a pull-up resistance 310 in the identification apparatus 100; inputting to the identification apparatus 100 an identification voltage value set by the at least one specific resistance and outputted from the TACH terminal 400; and identifying a type of the brushless DC motor 200 based on the identification voltage value.

According to the identification method as described above, each of multiple types of brushless DC motors 200 is configured to output at least one of an exclusively allocated Low level signal and an exclusively allocated High level signal from the TACH terminal 400, and this exclusive allocation enables identification of suppliers, products, or production lots.

In an embodiment, for example, the at least one specific resistance is the specific resistance 420 as described with reference to FIG. 2.

According to the identification method as described above, each of multiple types of brushless DC motors 200 is configured to output an exclusively allocated Low level signal from the TACH terminal 400, and this exclusive allocation enables identification of suppliers, products, or production lots.

In an embodiment, for example, the at least one specific resistance is the specific resistance 421 as described with reference to FIG. 13.

According to the identification method as described above, each of multiple types of brushless DC motors 200 is configured to output an exclusively allocated High level signal outputted from the TACH terminal 400, and this exclusive allocation enables identification of suppliers, products, or production lots.

In an embodiment, for example, the at least one specific resistance includes the first specific resistance 420 and the second specific resistance 421 electrically connected in series or in parallel to the first specific resistance 420 as described with reference to FIG. 15A or 15B.

According to the identification method as described above, each of multiple types of brushless DC motors 200 is configured to output an exclusively allocated combination of a Low level signal and a High level signal from the TACH terminal 400, and this exclusive allocation enables identification of a larger number of suppliers, products, or production lots.

In an embodiment, the identification method for a brushless DC motor 200 further includes: driving the brushless DC motor 200; inputting to the identification apparatus 100 the identification voltage value set by the at least one specific resistance and outputted from the TACH terminal 400 with the driving of the brushless DC motor 200; and identifying the type of the brushless DC motor 200 based on the identification voltage value.

According to the identification method as described above, the identification apparatus 100 can acquire the identification voltage value by issuing a rotation command.

In an embodiment, the identification method for the brushless DC motor 200 further includes: switching on and off the switching element 410 of the circuit board CB at a predetermined duty ratio for a preset period after the start of supply of the power supply voltage to the brushless DC motor 200; inputting to the identification apparatus 100 the identification voltage value set by the at least one specific resistance and outputted from the TACH terminal 400; and identifying the type of the brushless DC motor 200 based on the identification voltage value.

According to the identification method as described above, the direct control of the on and off of the switching element 410 allows the output signal Vlow to be obtained without rotating the motor.

In an embodiment, the identification method for the brushless DC motor 200 includes the following operations. Specifically, the identification apparatus 100 performs AD conversion of the identification voltage value to obtain a unique information piece of the brushless DC motor 200, and the identifying a type of the brushless DC motor 200 includes identifying the type of the brushless DC motor to be identified, based on the obtained unique information piece by referring to the LUT illustrated in FIG. 6, for example, in which multiple types of brushless DC motors are associated with multiple unique information pieces of brushless DC motors, the unique information pieces each allocated to one of the types of brushless DC motors.

According to the identification method as described above, the controller 110 of the identification apparatus 100 can identify the type of the brushless DC motor 200 to be identified based on the obtained unique information piece by referring to the table.

In an embodiment, each of the multiple unique information pieces of brushless DC motors is expressed by a digital value with a predetermined bit width, and a set of unique information pieces is grouped by a certain range of multiple digital values. The multiple digital values do not have overlap among the sets of the unique information pieces of brushless DC motors.

According to the identification method as described above, each of the multiple unique information pieces of brushless DC motors is expressed by using, for example, a 10-bit digital value, and a set of unique information pieces is grouped by a certain range of multiple digital values. Since the multiple digital values do not have overlap among the sets of the unique information pieces of brushless DC motors, reliable identification by referring to the table can be attained.

In an embodiment, for example as described with reference to FIGS. 7 to 9, the identification method for the brushless DC motor 200 further includes: inputting the identification voltage value and multiple reference voltages Vref allocated to the respective types of brushless DC motors to the comparator 500 to obtain a comparison result, and the identifying a type of the brushless DC motor 200 includes identifying the type of the brushless DC motor 200 to be identified based on the comparison result of the comparator 500.

According to the identification method as described above, it is possible to identify the type of the brushless DC motor 200 to be identified based on the comparison result of the comparator 500.

In an embodiment, the at least one terminal of the circuit board CB serves as an output terminal when the brushless DC motor 200 is in operation, for example as described with reference to FIG. 3.

The identification method as described above may use various output terminals that serve as output terminals when the brushless DC motor 200 is in operation.

In an embodiment, the at least one terminal of the circuit board CB is the TACH terminal, for example as described with reference to FIG. 1.

According to the identification method as described above, it is possible to identify a type of brushless DC motor having the simplest configuration including the TACH terminal.

In an embodiment, the at least one terminal of the circuit board CB includes multiple output terminals each having an open-collector or open-drain output function.

According to the identification method as described above, the multiple output terminals are the TACH terminal 400 and the DIRout terminal, for example as described above, and enable identification of a larger number of types of motors.

In an embodiment, the identification method for the brushless DC motor 200 includes providing a notification of an identification result of the type of the brushless DC motor.

According to the identification method as described above, for example, the controller 110 of the identification apparatus 100 may once write the identification result to the memory 120 or may transmit the identification result to another apparatus or device needing the identification result as explained above. Instead, it is possible to provide a notification of the identification result of the type of the brushless DC motor 200 by using a display device (for example, a liquid crystal display), a speaker, and so on.

In an embodiment, the identification method for the brushless DC motor 200 further includes: based on the identification result of the type of the brushless DC motor, selecting a light emitter 130 allocated to the brushless DC motor 200 to be identified from among multiple light emitters 130 allocated to the multiple types of brushless DC motors, and causing the selected light emitter 130 to emit light.

According to the identification method as described above, for example, a red LED may be allocated for the supplier A, a blue LED may be allocated for the supplier B, and a green LED may be allocated for the supplier C. When identifying the brushless DC motor of the supplier C, the controller 110 of the identification apparatus 100 can cause the green LED to emit light.

In an embodiment, the brushless DC motor 200 is, for example, a DC fan including an impeller.

According to the identification method as described above, it is possible to identify types of brushless DC motors 200 such as an axial fan, a centrifugal fan, a cross-flow fan, and a sirocco fan, for example.

An identification apparatus 100 in an exemplary embodiment of the present disclosure is an identification apparatus that identifies types of brushless DC motors 200. For example, as described with reference to FIGS. 1 and 2, each brushless DC motor 200 includes a circuit board CB on which at least one terminal with an open-collector or open-drain output function (for example, the TACH terminal 400) is mounted. The at least one terminal includes at least one specific resistance out of a specific resistance 420 electrically connected in series between an open-collector or open-drain switching element 410 and a pin 430 of the terminal, and a specific resistance 421 electrically connected in parallel to the switching element 410. The specific resistances 420 and the specific resistances 421 vary among multiple types of brushless DC motors. The identification apparatus 100 includes: a power supply terminal to supply a power supply voltage Vmot to a brushless DC motor 200; for example, a TACH terminal 300 electrically connected to the TACH terminal of the circuit board CB, and including a pull-up resistance 310 incorporated therein; and a controller 110 that identifies a type of the brushless DC motors 200. The controller 110 acquires an identification voltage value via the TACH terminal 300 and identifies the type of the brushless DC motor 200 based on the identification voltage value. Here, the identification voltage value is set by the at least one specific resistance and is outputted from the TACH terminal 400 of the circuit board CB when the power supply voltage Vmot is supplied to the brushless DC motor 200 via the power supply terminal and the pull-up resistance 310 is pulled up.

The identification apparatus as described above operates under the setting in which each of types of brushless DC motors 200 is configured to output at least one of an exclusively allocated Low level signal and an exclusively allocated High level signal the TACH terminal 400, and this exclusive allocation enables identification of suppliers, products, or production lots.

A brushless DC motor 200 in an exemplary embodiment of the present disclosure includes: a circuit board CB; at least one terminal (for example, the TACH terminal 400) that has an open-collector or open-drain output function and that is mounted on the circuit board CB; a coil 240; and a drive circuit that causes electricity to flow through the coil 240 as described above. The at least one terminal includes at least one specific resistance out of a specific resistance 420 electrically connected in series between an open-collector or open-drain switching element 410 and a pin 430 of the terminal, and a specific resistance 421 electrically connected in parallel to the switching element 410. The specific resistances 420 and the specific resistances 421 vary among multiple types of brushless DC motors. For example, the regulator 210, the motor drive IC 220, the inverter 230, and the Hall element 260 illustrated in FIG. 1 constitute a drive circuit that drives the motor by causing electricity to flow through the coil 240.

With the brushless DC motor as described above, each of types of brushless DC motors 200 is configured to output at least one of an exclusive allocated Low level signal and an exclusive allocated High level signal outputted from the TACH terminal 400, and this exclusive allocation enables identification of suppliers, products, or production lots.

Embodiments of the present disclosure may be used in a wide variety of instruments including various fan motors, such for example as personal computers, game devices, cleaners, dryers, washing machines, and refrigerators.

Features of the above-described preferred embodiments and the modifications thereof may be combined appropriately as long as no conflict arises.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An identification method for use in an identification apparatus that identifies a type of brushless DC motor, wherein the brushless DC motor includes a circuit board on which at least one terminal with an open-collector or open-drain output function is mounted, the at least one terminal includes at least one specific resistance out of a first specific resistance electrically connected in series between an open-collector or open-drain switching element and a pin of the at least one terminal, and a second specific resistance electrically connected in parallel to the switching element, the first specific resistances and the second specific resistances vary among a plurality of types of brushless DC motors, and the method comprises:
supplying a power supply voltage from the identification apparatus to the brushless DC motor;
supplying a voltage to a signal line of the at least one terminal of the circuit board via a pull-up resistance in the identification apparatus;
inputting an identification voltage value to the identification apparatus, the identification voltage value set by the at least one specific resistance and outputted from the at least one terminal; and
identifying a type of the brushless DC motor based on the identification voltage value.

2. The identification method according to claim 1, wherein the at least one specific resistance is the first specific resistance.

3. The identification method according to claim 1, wherein the at least one specific resistance is the second specific resistance.

4. The identification method according to claim 1, wherein the at least one specific resistance includes the first specific resistance, and the second specific resistance electrically connected in series or in parallel to the first specific resistance.

5. The identification method according to claim 1, further comprising:
driving the brushless DC motor;
inputting the identification voltage value to the identification apparatus, the identification voltage value set by the at least one specific resistance and outputted from the at least one terminal with the driving of the brushless DC motor; and
identifying the type of the brushless DC motor based on the identification voltage value.

6. The identification method according to claim 1, further comprising:
switching on and off the switching element of the circuit board at a predetermined duty ratio for a preset period after the start of the supply of the power supply voltage to the brushless DC motor;
inputting the identification voltage value to the identification apparatus, the identification voltage value set by the at least one specific resistance and outputted from the at least one terminal; and
identifying the type of the brushless DC motor based on the identification voltage value.

7. The identification method according to claim 1, wherein
the identification apparatus performs AD conversion of the identification voltage value to obtain a unique information piece of the brushless DC motor, and
the identifying a type of the brushless DC motor includes identifying the type of the brushless DC motor to be identified, based on the obtained unique information piece by referring to a table in which the plurality of types of brushless DC motors are associated with a plurality of unique information pieces of brushless DC motors, the unique information pieces each allocated to one of the plurality of types of brushless DC motors.

8. The identification method according to claim 7, wherein
each of the unique information pieces of brushless DC motors is expressed by a digital value with a predetermined bit width,
a set of unique information pieces is classified by a certain range of a plurality of digital values, and
the pluralities of digital values do not have overlap among the sets of unique information pieces of brushless DC motors.

9. The identification method according to claim 1, further comprising inputting the identification voltage value and a plurality of reference voltages allocated to the respective types of brushless DC motors to a comparator to obtain a comparison result, wherein
the identifying a type of the brushless DC motor includes identifying the type of the brushless DC motor to be identified based on the comparison result of the comparator.

10. The identification method according to claim 1, wherein the at least one terminal of the circuit board is a terminal to be used as an output terminal when the brushless DC motor is in operation.

11. The identification method according to claim 10, wherein the at least one terminal of the circuit board is a terminal for tachometer.

12. The identification method according to claim 1, wherein the at least one terminal of the circuit board includes a plurality of output terminals each having an open-collector or open-drain output function.

13. The identification method according to claim 1, wherein the identification apparatus further provides a notification of an identification result of the type of the brushless DC motor.

14. The identification method according to claim 1, further comprising, based an identification result of the type of the brushless DC motor, selecting a light emitter allocated to the brushless DC motor to be identified from among a plurality of light emitters allocated to the plurality of types of brushless DC motors, and causing the selected light emitter to emit light.

15. The identification method according to claim 1, wherein the brushless DC motor is a fan motor including an impeller.

16. An identification apparatus that identifies a type of brushless DC motor, wherein
the brushless DC motor includes a circuit board on which at least one terminal with an open-collector or open-drain output function is mounted,
the at least one terminal includes at least one specific resistance out of a first specific resistance electrically connected in series between an open-collector or open-drain switching element and a pin of the at least one terminal, and a second specific resistance electrically connected in parallel to the switching element,
the first specific resistances and the second specific resistances vary among a plurality of types of brushless DC motors,
the identification apparatus comprises:
a power supply terminal that supplies a power supply voltage to the brushless DC motor;

an input terminal that is electrically connected to the at least one terminal of the circuit board, and that includes a pull-up resistance incorporated therein; and a controller that identifies a type of the brushless DC motor, the controller acquires, via the input terminal, an identification voltage value set by the at least one specific resistance and outputted from the at least one terminal of the circuit board when the power supply voltage is supplied to the brushless DC motor via the power supply terminal and the pull-up resistance is pulled up, and the controller identifies the type of the brushless DC motor based on the identification voltage value.

17. A brushless DC motor comprising:

a circuit board;

at least one terminal that has an open-collector or open-drain output function and that is mounted on the circuit board;

a coil; and a drive circuit that causes electricity to flow through the coil, wherein the at least one terminal includes at least one specific resistance out of a first specific resistance electrically connected in series between an open-collector or open-drain switching element and a pin of the at least one terminal, and a second specific resistance electrically connected in parallel to the switching element, and the first specific resistances and the second specific resistances vary among a plurality of types of brushless DC motors.

* * * * *